United States Patent
Krishna et al.

(10) Patent No.: US 10,679,827 B2
(45) Date of Patent: Jun. 9, 2020

(54) METHOD AND APPARATUS FOR SEMICONDUCTOR PROCESSING CHAMBER ISOLATION FOR REDUCED PARTICLES AND IMPROVED UNIFORMITY

(71) Applicant: Applied Materials, Inc., Santa Clara, CA (US)

(72) Inventors: Gopu Krishna, Bengaluru (IN); Ravikumar Patil, Bengaluru (IN); Hanish Kumar Panavalappil Kumarankutty, Bengaluru (IN); Somil Kapadia, Mumbai (IN); Sonny Kunnakkat, Bengaluru (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 95 days.

(21) Appl. No.: 15/866,506

(22) Filed: Jan. 10, 2018

(65) Prior Publication Data

US 2018/0211820 A1  Jul. 26, 2018

Related U.S. Application Data

(60) Provisional application No. 62/518,089, filed on Jun. 12, 2017.

(30) Foreign Application Priority Data

Jan. 25, 2017 (IN) .............................. 201741002883

(51) Int. Cl.
*H01J 37/32* (2006.01)
*C23C 16/50* (2006.01)
(Continued)

(52) U.S. Cl.
CPC .... *H01J 37/32513* (2013.01); *C23C 16/4412* (2013.01); *C23C 16/458* (2013.01);
(Continued)

(58) Field of Classification Search
CPC .......... H01J 37/32513; H01J 37/32834; H01J 37/32899; H01J 37/32724;
(Continued)

(56) References Cited

U.S. PATENT DOCUMENTS 9,269,547 B2 * 2/2016 Cheng ................ H01J 37/3288
9,947,517 B1 * 4/2018 Luere ................ H01J 37/32642
(Continued)

*Primary Examiner* — Bac H Au
(74) *Attorney, Agent, or Firm* — Patterson + Sheridan, LLP

(57) ABSTRACT

Implementations of the present disclosure generally relate to apparatus and methods for uniform deposition of thin films on substrates. In one implementation, a plasma-processing chamber comprises a chamber body including chamber walls, a chamber floor, and a lid support. The plasma-processing chamber further comprises a substrate support assembly at least partially disposed within the chamber body and configured to support a substrate. The plasma-processing chamber further comprises a lid assembly disposed over the support assembly and positioned on the lid support wherein the lid assembly and the chamber body define a first processing volume. The plasma-processing chamber further comprises a bottom isolation assembly that circumscribes at least a portion of the substrate support assembly and is vertically movable from a loading position to a processing position. A seal is formed between the bottom isolation assembly and the lid assembly when the bottom isolation assembly is in the processing position.

22 Claims, 7 Drawing Sheets

(51) Int. Cl.
*C23C 16/458* (2006.01)
*C23C 16/44* (2006.01)
*H01L 21/02* (2006.01)
*H01L 21/285* (2006.01)

(52) U.S. Cl.
CPC .......... C23C 16/4586 (2013.01); C23C 16/50 (2013.01); H01J 37/32724 (2013.01); H01J 37/32834 (2013.01); H01J 37/32899 (2013.01); H01J 2237/2001 (2013.01); H01J 2237/20235 (2013.01); H01J 2237/3321 (2013.01); H01J 2237/3323 (2013.01); H01L 21/02274 (2013.01); H01L 21/28556 (2013.01)

(58) Field of Classification Search
CPC ..... H01J 2237/3321; H01J 2237/20235; H01J 2237/3323; H01J 2237/2001; C23C 16/4586; C23C 16/4412; C23C 16/50; C23C 16/458; H01L 21/02274; H01L 21/28556

See application file for complete search history.

(56) References Cited

U.S. PATENT DOCUMENTS

| | | | |
|---|---|---|---|
| 10,184,179 B2 * | 1/2019 | Kurita | ............... C23C 16/45548 |
| 2005/0229849 A1 | 10/2005 | Silvetti et al. | |
| 2006/0084266 A1 * | 4/2006 | Narushima | ........... C23C 18/161 |
| | | | 438/674 |
| 2011/0265884 A1 | 11/2011 | Xu et al. | |
| 2011/0265951 A1 | 11/2011 | Xu et al. | |
| 2016/0002779 A1 | 1/2016 | Lin et al. | |
| 2016/0083837 A1 * | 3/2016 | Narushima | ......... C23C 16/4408 |
| | | | 118/725 |
| 2016/0189987 A1 * | 6/2016 | Amikura | ........... H01L 21/67069 |
| | | | 156/345.29 |
| 2016/0268141 A1 * | 9/2016 | Hudson | ............. H01L 21/31138 |
| 2017/0198395 A1 * | 7/2017 | Nozawa | ............... H01L 21/3065 |

* cited by examiner

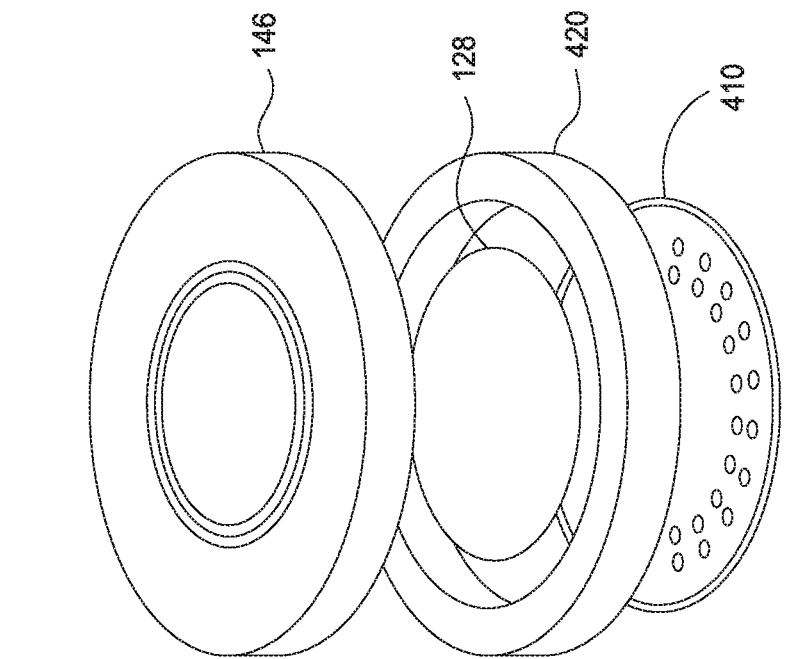
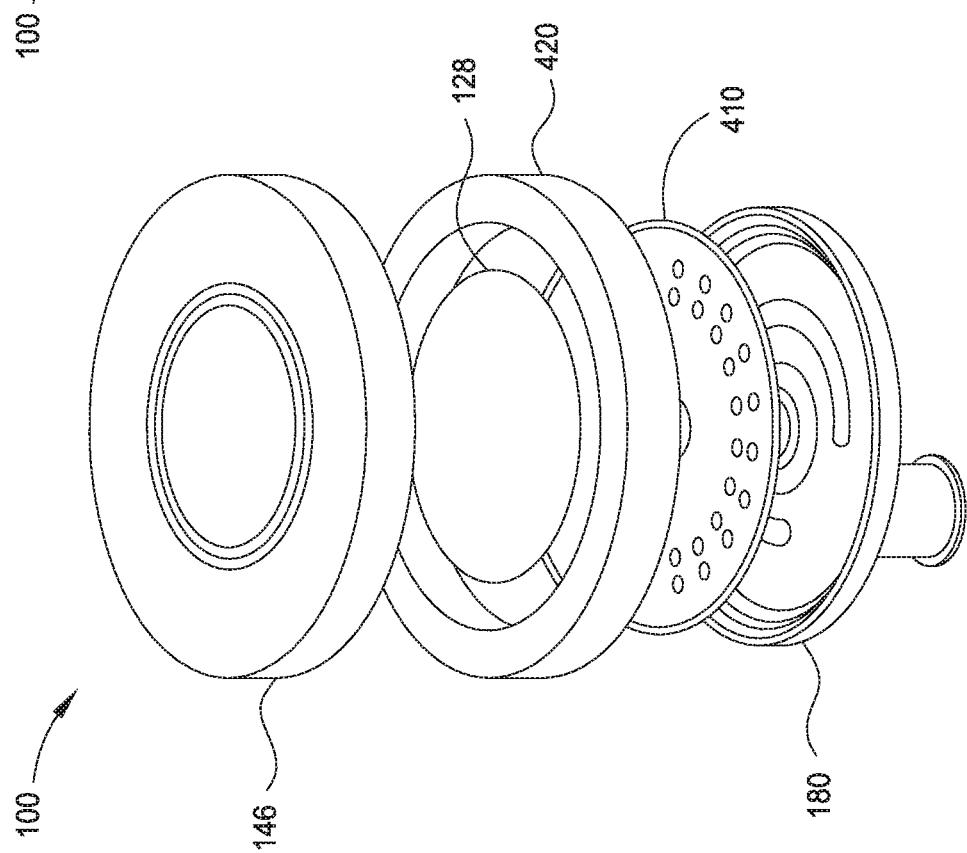

METHOD AND APPARATUS FOR SEMICONDUCTOR PROCESSING CHAMBER ISOLATION FOR REDUCED PARTICLES AND IMPROVED UNIFORMITY

CROSS-REFERENCE TO RELATED APPLICATIONS

This application claims benefit of U.S. Provisional Patent Application Ser. No. 62/518,089, filed Jun. 12, 2017, and India Provisional Application No. 201741002883, filed Jan. 25, 2017, both of which are incorporated herein by reference in their entirety.

BACKGROUND

Field

Implementations of the present disclosure generally relate to apparatus and methods for uniform deposition of thin films on substrates with increased uniformity.

Description of the Related Art

Semiconductor processing involves a number of different chemical and physical processes enabling minute integrated circuits to be created on a substrate. Layers of materials, which make up the integrated circuit, are created by chemical vapor deposition, physical vapor deposition, epitaxial growth, and the like. Some of the layers of material are patterned using photoresist masks and wet or dry etching techniques. The substrate utilized to form integrated circuits may be silicon, gallium arsenide, indium phosphide, glass, or other appropriate material.

In the manufacture of integrated circuits, plasma processes are often used for deposition or etching of various material layers. Plasma processing offers many advantages over thermal processing. For example, plasma enhanced chemical vapor deposition (PECVD) allows deposition processes to be performed at lower temperatures and at higher deposition rates than achievable in analogous thermal processes. Thus, PECVD is advantageous for integrated circuit fabrication with stringent thermal budgets, such as for very large scale or ultra-large scale integrated circuit (VLSI or ULSI) device fabrication.

The design of current semiconductor processing chambers creates non-uniformities in the deposited film due to the asymmetry of the processing chamber volume and RF environment. This non-uniformity can be due to the structural, gas delivery or pumping asymmetry of the processing environment. The use of pumping plates, liners and other alignment apparatus has been unable to mitigate the asymmetry in the processing volume of the chamber, especially in the slit-valve tunnel volume. These asymmetries create distortion in the processing volume, which affects the uniformity of the film deposited on the substrate and further creates particulates.

Therefore, there is a need for methods and apparatus for increasing uniformity of thin films deposited on a substrate.

SUMMARY

Implementations of the present disclosure generally relate to apparatus and methods for uniform deposition of thin films on substrates with increased uniformity. In one implementation, a plasma-processing chamber is provided. The plasma-processing chamber comprises a chamber body including chamber walls, a chamber floor, and a lid support. The plasma-processing chamber further comprises a substrate support assembly at least partially disposed within the chamber body and configured to support a substrate. The plasma-processing chamber further comprises a lid assembly disposed over the support assembly and positioned on the lid support wherein the lid assembly and the chamber body define a first processing volume. The plasma-processing chamber further comprises a bottom isolation assembly that circumscribes at least a portion of the substrate support assembly and is vertically movable from a loading position to a processing position. A seal is formed between the bottom isolation assembly and the lid assembly when the bottom isolation assembly is in the processing position.

In another implementation, a twin chamber processing system for processing substrates is provided. The twin chamber processing system comprises a first processing chamber. The first processing chamber comprises a first chamber body including first chamber walls, a first chamber floor, and a first lid support, a first substrate support assembly at least partially disposed within the first chamber body and configured to support a first substrate, a first lid assembly disposed over the first support assembly and positioned on the first lid support wherein the first lid assembly and the first chamber body define a first processing volume, and a first bottom isolation assembly that circumscribes at least a portion of the first substrate support assembly and is vertically movable from a loading position to a processing position. A first seal is formed between the first bottom isolation assembly and the first lid assembly when the first bottom isolation assembly is in the processing position. The twin chamber processing system further comprises a second processing chamber. The second processing chamber comprises a second chamber body including second chamber walls, a second chamber floor, and a second lid support, a second substrate support assembly at least partially disposed within the second chamber body and configured to support a second substrate, a second lid assembly disposed over the second support assembly and positioned on the second lid support wherein the second lid assembly and the second chamber body define a second processing volume and a second bottom isolation assembly that circumscribes at least a portion of the second substrate support assembly and is vertically movable from a loading position to a processing position. A second seal is formed between the second bottom isolation assembly and the second lid assembly when the second bottom isolation assembly is in the processing position. In some implementations, the first bottom isolation assembly and the first lid assembly define a third processing volume, which is smaller than, and within the first processing volume when the first bottom isolation assembly is in the second position. In some implementations, the second bottom isolation assembly and the second lid assembly define a fourth processing volume, which is smaller than, and within the second processing volume when the second bottom isolation assembly is in the second position. In some implementations, the third processing volume and the fourth processing volume are substantially identical volumes.

In yet another implementation, a method of processing a substrate is provided. The method comprises providing a processing chamber. The processing chamber comprises a chamber body and a chamber lid assembly disposed over the chamber body. The chamber body and the chamber lid assembly define a first processing volume and a substrate support pedestal is positioned within the first processing volume. The method further comprises positioning a bottom isolation assembly in a loading position. The bottom isolation assembly circumscribes at least a portion of the substrate support pedestal and the bottom isolation assembly is spaced-apart from the chamber lid assembly positioned above the bottom isolation assembly. The method further comprises positioning a substrate on the substrate support pedestal. The method comprises moving the bottom isolation assembly into a processing position. A seal is formed between the bottom isolation assembly and the chamber lid assembly defining a second processing volume that is positioned within and isolated from the first processing volume. The method further comprises processing the substrate.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

FIG. 4A is an exploded perspective view of a portion of a plasma-processing system incorporating a bottom isolation assembly according to implementations described herein;

FIG. 4B is an exploded perspective view of a portion of a plasma-processing system incorporating a bottom isolation assembly according to implementations described herein.

Figure 1:
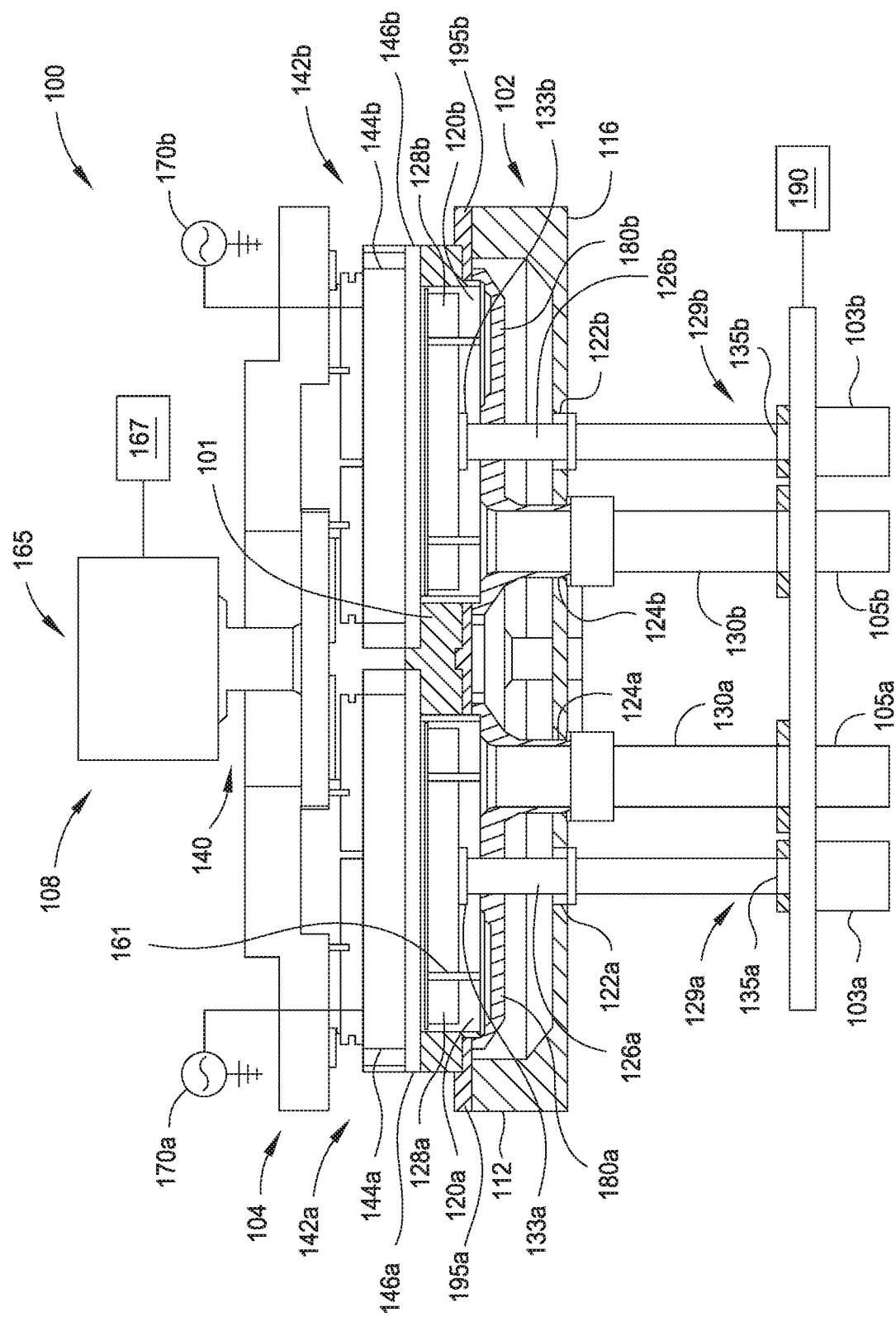
FIG. 1 is a partial schematic cross-sectional view of a plasma system incorporating a bottom isolation assembly according to implementations described herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes plasma-processing systems and components of plasma-processing systems. Certain details are set forth in the following description and in FIGS. 1-5 to provide a thorough understanding of various implementations of the disclosure. Other details describing well-known structures and systems often associated with plasma-processing systems and components of plasma-processing systems are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a plasma deposition process that can be carried out using any suitable thin film deposition system. Examples of suitable systems include the CENTURA® systems which may use a DXZ® processing chamber, PRECISION 5000® systems, PRODUCER® systems, PRODUCER® GT™ systems, PRODUCER® XP PRECISION™ systems and PRODUCER® SE™ systems which are commercially available from Applied Materials, Inc., of Santa Clara, Calif. The PRODUCER® SE CVD system chamber (e.g., 200 mm or 300 mm) has two isolated processing volumes that may be used to deposit thin films on substrates, such as conductive films, oxide films such as silicon oxide films, carbon-doped silicon oxides and other materials. Although the exemplary implementation includes two processing volumes, it is contemplated that implementations disclosed herein may be used to advantage in systems having a single processing volume or more than two processing volumes. It is also contemplated that implementations disclosed herein may be utilized to advantage in other plasma chambers, including etch chambers, ion implantation chambers, plasma treatment chambers, and in resist stripping chambers, among others. It is further contemplated that implementations disclosed herein may be utilized to advantage in plasma-processing chambers available from other manufacturers. The apparatus description described herein is illustrative and should not be construed or interpreted as limiting the scope of the implementations described herein.

A method and apparatus for semiconductor processing chamber isolation are disclosed herein. The processing chamber isolation can be achieved using a ceramic or metal "bottom isolation assembly" or "bottom can assembly" positioned inside the processing chamber. The terms "bottom isolation assembly" or "bottom can assembly" are used interchangeably throughout the specification. A seal is formed between the bottom isolation assembly and the chamber wall or other chamber components (e.g., chamber lid) to create a uniform and isolated processing volume within the processing volume of the processing chamber for processing the semiconductor substrate. This uniform and isolated processing volume is isolated from the processing volume of the processing chamber. This uniform and isolated processing volume is further isolated from the atmosphere outside the processing chamber. In some implementations, the sealing between the bottom isolation assembly and the chamber wall can be achieved by O-rings (elastomer or metal), gas shower curtains or by pressure differential air sealing (e.g., controlling the pressure between the isolated processing volume and the processing volume of the processing chamber.

In some implementations, the bottom isolation assembly typically includes components like pumping plates and coaxial pumping assemblies for uniform pumping of the process volume and optionally water-cooling channels to regulate the temperature of the bottom isolation assembly. In some implementations, the bottom isolation assembly further includes an apparatus to locate and position the substrate accurately in the process volume and RF hardware components to filter and tune RF signals.

After processing of the substrate is completed, the bottom isolation assembly translates linearly away from the process volume on a linear guide or some other means, hence breaking the effective seal against the chamber. The substrate is removed from the processing chamber through a slit-valve and the processing chamber is prepared for processing of the next substrate.

FIG. 1 is a partial cross sectional view of a plasma-processing system 100 incorporating a bottom isolation assembly 180a, 180b (collectively 180) according to implementations described herein. The bottom isolation assembly 180 is depicted in a processing position where the bottom isolation assembly 180 forms a seal with a portion of the plasma-processing system 100. The plasma-processing system 100 functions as a plasma-enhanced chemical vapor deposition (PECVD) chamber capable of depositing, among other things, dielectric materials on a substrate.

The plasma-processing system 100 generally comprises a processing chamber body 102 having sidewalls 112, a bottom wall 116 and a shared interior sidewall 101 defining a pair of processing volumes 120a and 120b (collectively 120). The processing chamber body 102 is typically fabricated from welded plates of stainless steel or a unitary block of aluminum. In one implementation, the sidewalls 112 comprise aluminum and the bottom wall 116 comprises stainless steel. The sidewalls 112 generally contain a slit valve (not shown in this view) to provide entry and egress of a substrate from the plasma-processing system 100. Each of the processing volumes 120a, 120b is similarly configured and for the sake of brevity, only components in the processing volume 120b will be described.

A pedestal assembly 128a, 128b (collectively 128) is disposed in the processing volume 120 through a passage 122a, 122b (collectively 122) formed in the bottom wall 116 in the plasma-processing system 100. The pedestal assembly 128 supports a substrate during processing. The pedestal assembly 128 provides a heater adapted to support a substrate (not shown) on the upper surface thereof. The pedestal assembly 128 may include heating elements, for example resistive heating elements, to heat and control the substrate temperature at a desired process temperature. Alternatively, the pedestal assembly 128 may be heated by a remote heating element, such as a lamp assembly.

The pedestal assembly 128 may be an electrostatic chuck, a ceramic body, a heater or a combination thereof. In one implementation, the pedestal assembly 128 is an electrostatic chuck that includes a dielectric body having a conductive layer embedded therein. The dielectric body is typically fabricated from a high thermal conductivity dielectric material such as pyrolytic boron nitride, aluminum nitride, silicon nitride, alumina or an equivalent material. In one implementation, the pedestal assembly 128 acts as a bottom electrode and is biased by an RF power source (typically via a matching network). In one implementation, the substrate support is rotatable.

The pedestal assembly 128 is coupled by a flange 133a, 133b (collectively 133) to a support shaft 126a, 126b (collectively 126). The support shaft 126a, 126b (collectively 126) couples the pedestal assembly 128 to a power outlet or power box 103a, 103b (collectively 103). The power box 103 may include a drive system that controls the elevation and movement of the pedestal assembly 128 within the processing volume 120. The support shaft 126 also contains electrical power interfaces to provide electrical power to the pedestal assembly 128. The power box 103 also includes interfaces for electrical power and temperature indicators, such as a thermocouple interface. The support shaft 126 also includes a base assembly 129a, 129b (collectively 129) adapted to detachably couple to the power box 103 thereto. A circumferential ring 135a, 135b (collectively 135) is shown above the power box 103. In one implementation, the circumferential ring 135 is a shoulder adapted as a mechanical stop or land configured to provide a mechanical interface between the base assembly 129 and the upper surface of the power box 103.

An actuator 130a, 130b (collectively 130) is disposed through a second passage 124a, 124b (collectively 124) formed in the bottom wall 116 of the processing volume 120 and is utilized to position the bottom isolation assembly 180 relative to chamber lid assembly 104. The actuator 130 is coupled with a second power outlet or power box 105a, 105b (collectively 105). The second power box 105 may include a drive system that controls the elevation and movement of the bottom isolation assembly 180 within the processing volume 120. The actuator 130 also contains electrical power interfaces to provide electrical power to the bottom isolation assembly 180. Thus, the bottom isolation assembly 180 and the pedestal assembly 128 are independently movable relative to each other.

In one implementation, one or more substrate lift pins 161 rest on a surface of the bottom isolation assembly 180 and move vertically as the bottom isolation assembly 180 moves. The one or more substrate lift pins 161 extend through the pedestal assembly 128. The one or more substrate lift pins 161 selectively space the substrate from the pedestal assembly 128 to facilitate exchange of the substrate with a robot (not shown) utilized for transferring the substrate into and out of the processing volume 120 through a substrate transfer port (not shown) when the bottom isolation assembly 180 is in a loading/unloading position. In operation, the one or more substrate lift pins 161 remain stationary on the bottom isolation assembly 180 and as the pedestal assembly 128 moves downward the one or more substrate lift pins 161 extend through the body of the pedestal assembly 128 raising the substrate above the surface of the pedestal assembly 128.

A chamber lid assembly 104 is coupled to a top portion of the processing chamber body 102. The chamber lid assembly 104 accommodates one or more gas distribution systems 108 coupled thereto. In some implementations, a remote plasma source 165 is coupled with the chamber lid assembly 104. The chamber lid assembly 104 includes a gas inlet passage 140, which delivers reactant and cleaning gases from the remote plasma source 165 through a showerhead assembly 142a, 142b (collectively 142) and into the processing volume 120b. A gas source 167 is configured to supply gas to the remote plasma source 165. The gas source may comprise a processing gas source or a cleaning gas source.

Each showerhead assembly 142 includes a blocker plate 144a, 144b (collectively 144) disposed intermediate to a faceplate 146a, 146b (collectively 146). The faceplate 146 includes a plurality of gas passages. In some implementations, a radio frequency (RF) source 170a, 170b (collectively 170) is coupled to each showerhead assembly 142. The RF source 170 powers the showerhead assembly 142 to facilitate generation of a plasma between the faceplate 146 of the showerhead assembly 142 and the heated pedestal assembly 128. In one implementation, the RF source 170 may be a high frequency radio frequency (HFRF) power source, such as a 13.56 MHz RF generator. In another implementation, RF source 170 may include a HFRF power source and a low frequency radio frequency (LFRF) power source, such as a 300 kHz RF generator. Alternatively, the RF source may be coupled to other portions of the processing chamber body 102, such as the pedestal assembly 128, to facilitate plasma generation.

As depicted in FIG. 1, the bottom isolation assembly 180 forms a seal with a portion of the plasma-processing system 100 (e.g., the chamber lid assembly 104) while the bottom isolation assembly 180 is in a processing position. The bottom isolation assembly 180 and the chamber lid assembly 104 define a second processing volume that is smaller than, and within the processing volume 120 when the bottom isolation assembly 180 is in the processing position. In some implementations, a seal 195a, 195b (collectively 195) (e.g., O-ring) is disposed between the chamber lid assembly 104 and the bottom isolation assembly 180 to separate the second processing volume from the processing volume 120. In some implementations, where the seal 195 is not present, the bottom isolation assembly 180 contacts the chamber lid assembly 104 to form a seal that isolates the second processing volume from the processing volume 120. In some implementations where seal 195 is not present and the bottom isolation assembly 180 does not contact the chamber lid assembly 104, a small gap exists between the bottom isolation assembly 180 and the chamber lid assembly 104. In implementations where there is a small gap, separation/isolation between the processing volume 120 and the second processing volume may be maintained by maintaining differential pressures between processing volume 120 and the second processing volume. In some implementations where there is a small gap, separation/isolation between the processing volume 120 and the second processing volume may be maintained by a purge gas curtain.

In some implementations, a dielectric isolator ring (not shown) is disposed between the chamber lid assembly 104 and the showerhead assembly 142 to prevent conducting RF power to the chamber lid assembly 104.

The plasma-processing system 100 is controlled by a controller 190 that comprises program code having instruction sets to operate components of the plasma-processing system 100 to process substrates in the plasma-processing system 100. For example, the controller 190 can comprise program code that includes a substrate positioning instruction set to operate the pedestal assembly 128; a bottom isolation assembly positioning instruction to operate the bottom isolation assembly 180; a gas flow control instruction set to operate gas flow control valves to set a flow of gases to the plasma-processing system 100; a gas pressure control instruction set to operate a throttle valve to maintain a pressure in the plasma-processing system 100; a temperature control instruction set to control a temperature control system (not shown) in the pedestal assembly 128 or sidewall 112 to set temperatures of the substrate or sidewalls 112, respectively; and a process monitoring instruction set to monitor the process in the plasma-processing system 100.

Figure 2A:
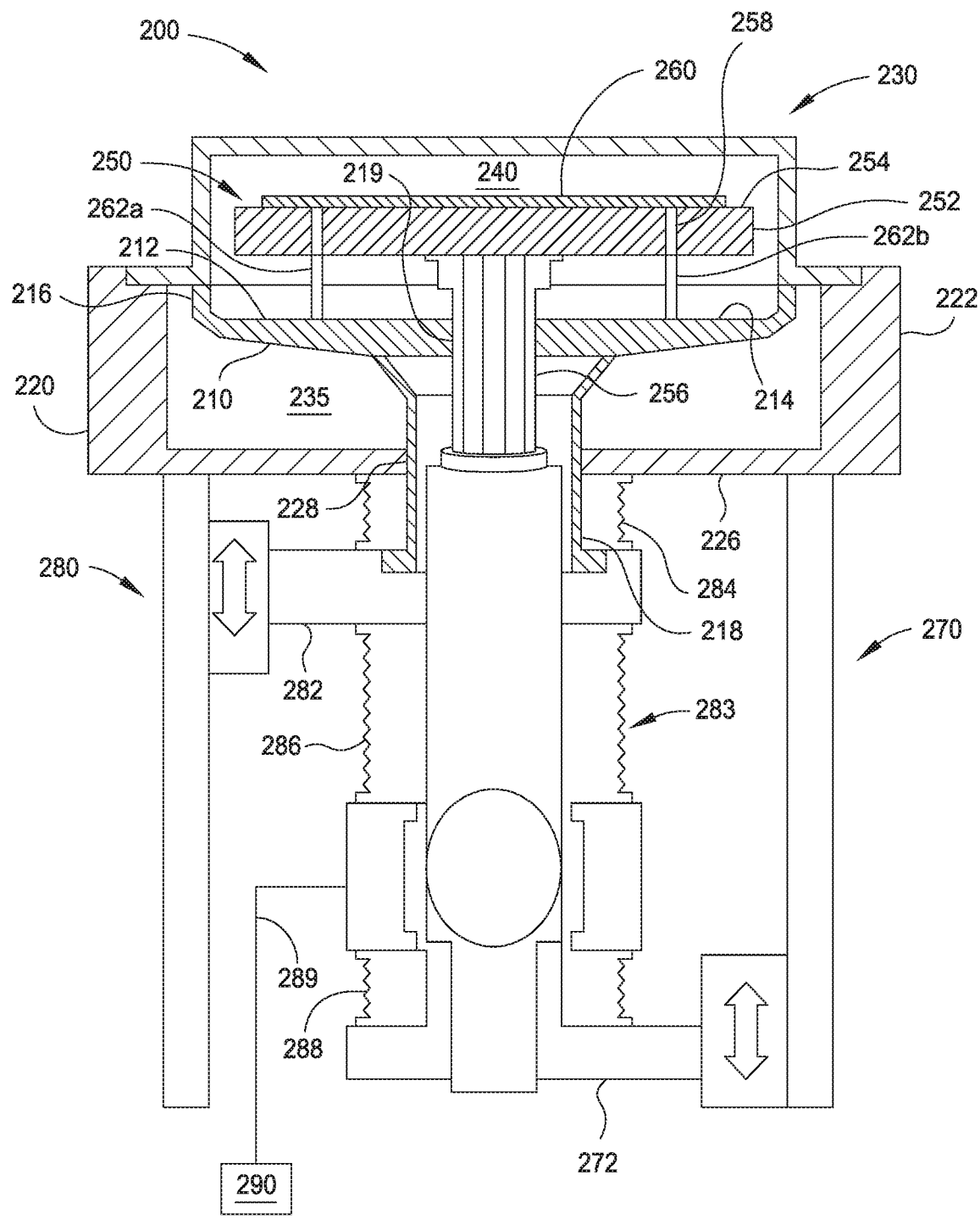
FIG. 2A is a partial schematic cross-sectional view of another plasma system incorporating a bottom isolation assembly in a processing position according to implementations described herein.
Figure 2B:
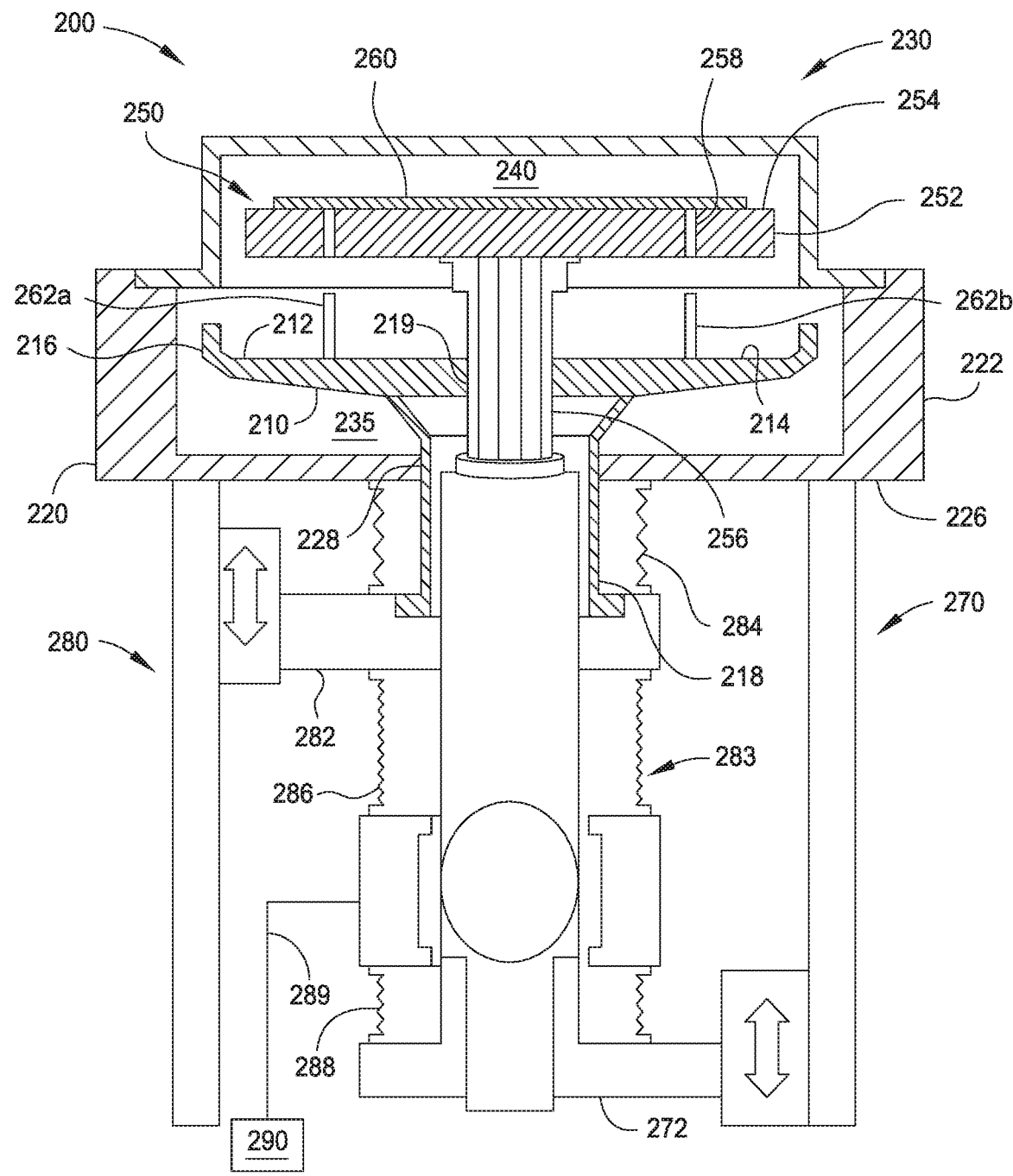
FIG. 2B is a partial schematic cross-sectional view of the plasma processing system of FIG. 2A in a loading position according to implementations described herein.

FIG. 2A is a partial cross-sectional view of another plasma-processing system 200 incorporating a bottom isolation assembly 210 in a processing position according to implementations described herein. FIG. 2B is a partial cross-sectional view of the plasma-processing system 200 incorporating the bottom isolation assembly 210 in a loading/unloading position according to implementations described herein. The plasma-processing system 200 includes a processing chamber body 220 interfaced with a processing lid assembly 230. The processing chamber body 220 and the processing lid assembly 230 define a first processing volume 235. A substrate support assembly 250 having a substrate 260 disposed thereon is disposed in the first processing volume 235. The bottom isolation assembly 210 is depicted in a processing position where the bottom isolation assembly 210 forms a seal with the processing lid assembly 230. In the processing position, the processing chamber body 220 and processing lid assembly 230 define a second processing volume 240 within the first processing volume 235. As depicted in FIG. 2A the second processing volume 240 is smaller than the first processing volume 235.

The processing chamber body 220 has sidewalls 222 and a bottom wall 226, which define a portion of the first processing volume 235. A passage 228 for accommodating the substrate support assembly 250 is formed in the bottom wall 226 of the processing chamber body 220.

A simplified version of the processing lid assembly 230 is depicted in FIG. 2A. The processing lid assembly 230 is coupled to a top portion of the processing chamber body 220. The processing lid assembly 230 accommodates one or more gas distribution systems coupled thereto. Although not shown, the processing lid assembly typically includes a showerhead assembly including, for example, an annular base plate having a blocker plate disposed intermediate to a faceplate as depicted in FIG. 1.

The substrate support assembly 250 includes a support pedestal 252 having a support surface 254 for supporting a substrate 260. The support pedestal 252 includes one or more lift pinholes 258 for accommodating lift pins 262a, 262b. In some implementations, the support pedestal 252 includes a heater (not shown) for heating the substrate 260. The support pedestal 252 is coupled to a support shaft 256. The support shaft 256 extends through the passage 228 formed in the bottom wall 226 of the processing chamber body 220.

The bottom isolation assembly 210 includes a base plate 212 having a bottom surface 214 circumscribed by a sidewall 216 and a pedestal stem 218, which supports the base plate 212. A passage 219 for accommodating the support shaft 256 of the substrate support assembly 250 extends through the base plate 212.

In one implementation, the bottom isolation assembly 210 may be formed from a conductive material, such as metal or metal alloys. In one implementation, the bottom isolation assembly 210 is formed from a metal. Exemplary metals for forming the bottom isolation assembly 210 may be selected from the group of aluminum, steel, stainless steel (e.g., iron-chromium alloys optionally containing nickel), iron, nickel, chromium, an alloy thereof, and combinations thereof. In another implementation, the bottom isolation assembly 210 is formed from a ceramic material. Exemplary ceramic materials include for example, aluminum nitride ($Al_xN_y$) or aluminum oxide ($Al_2O_3$).

The bottom isolation assembly 210 circumscribes at least a portion of the substrate support assembly 250. The bottom isolation assembly 210 is vertically movable from a loading position to a processing position. In the loading position, the bottom isolation assembly 210 does not form a seal with the processing lid assembly 230. In the processing position, a seal is formed between the bottom isolation assembly 210 and the processing lid assembly 230 while in the processing position.

The bottom isolation assembly 210 is independently movable relative to the substrate support assembly 250. The support shaft 256 couples the support pedestal 252 to a first linear actuator assembly 270 (e.g., one or more linear actuators) via a first movable bracket 272. The pedestal stem 218 couples the bottom isolation assembly 210 to a second linear actuator assembly 280 (e.g., one or more linear actuators) via a second movable bracket 282. In some implementations, the pedestal stem 218 also serves as an exhaust conduit for removing spent process gases and byproducts from the second processing volume 240. The pedestal stem 218 may be in fluid communication with a throttle-valve for controlling the pressure of the gas in the first processing volume 235, the second processing volume 240, or both the first processing volume 235 and the second processing volume 240. In one implementation, as depicted in FIG. 2A, the first movable bracket 272 and the second movable bracket 282 are connected through serially and coaxially assembled bellows 283. The coaxially assembled bellows includes a first stage bellows 284, a second stage bellows 286, and a third stage bellows 288.

A foreline conduit 289 is coupled with the first processing volume 235 and the second processing volume 240 for removing processing gases from the first processing volume 235 and the second processing volume. The foreline conduit 289 is typically coupled with a vacuum source 290. The foreline conduit 289 can be fixed or movable depending upon the number of bellows. In some implementations where there are two bellow stages, the foreline conduit 289 is movable. In some implementations where there are three bellow stages, the foreline conduit 289 is fixed.

As depicted in FIG. 2A, while the bottom isolation assembly 210 is in the processing position, the second processing volume 240 is physically isolated from the first processing volume 235 and the first processing volume 235 is physically isolated from atmosphere outside of the plasma-processing system 200. As depicted in FIG. 2B, while the bottom isolation assembly 210 is in the loading/unloading position, the first processing volume 235 and the second processing volume 240 share a common environment.

Figure 3A:
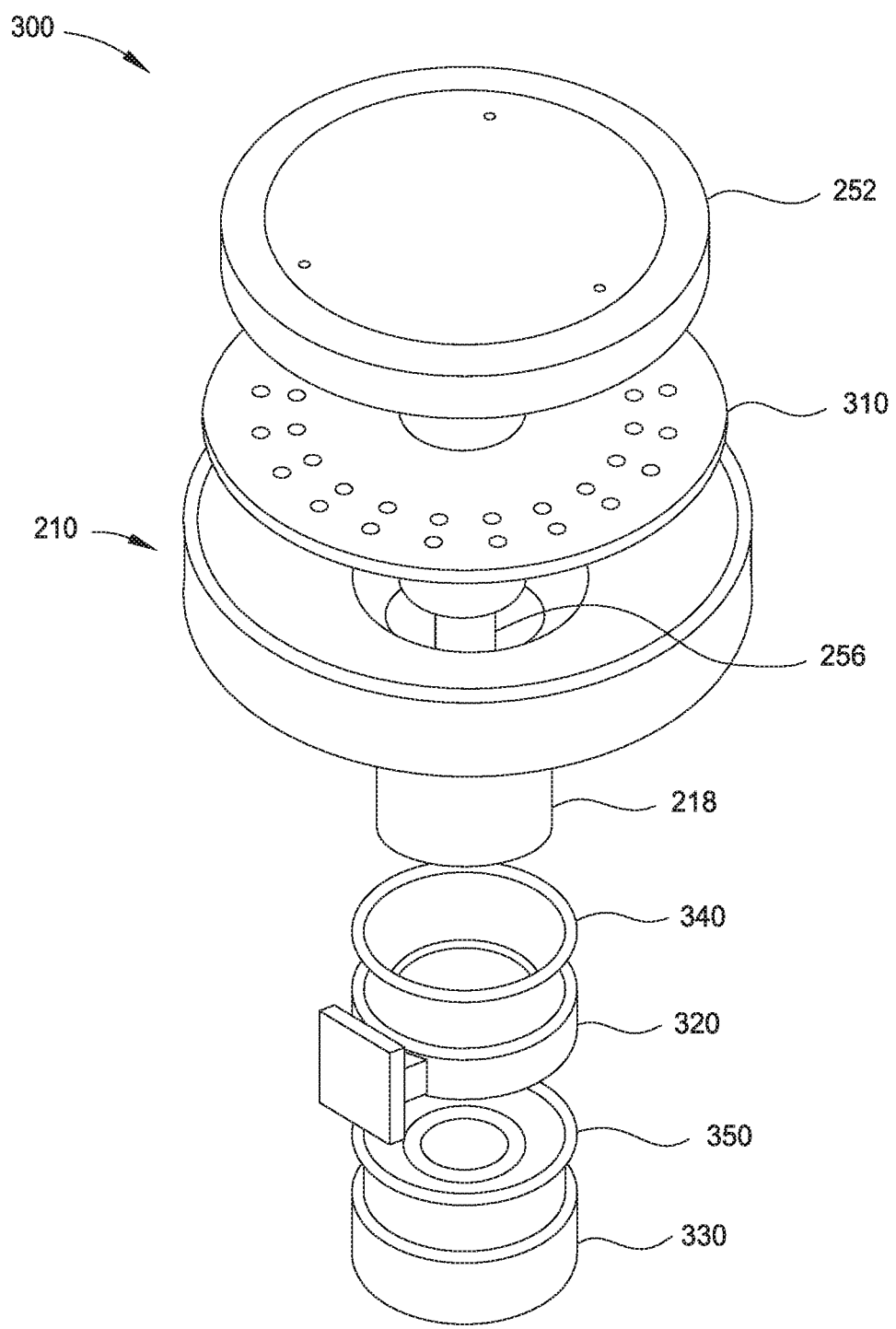
FIG. 3A is an exploded perspective view of a portion of a plasma-processing system incorporating a bottom isolation assembly according to implementations described herein.
Figure 3B:
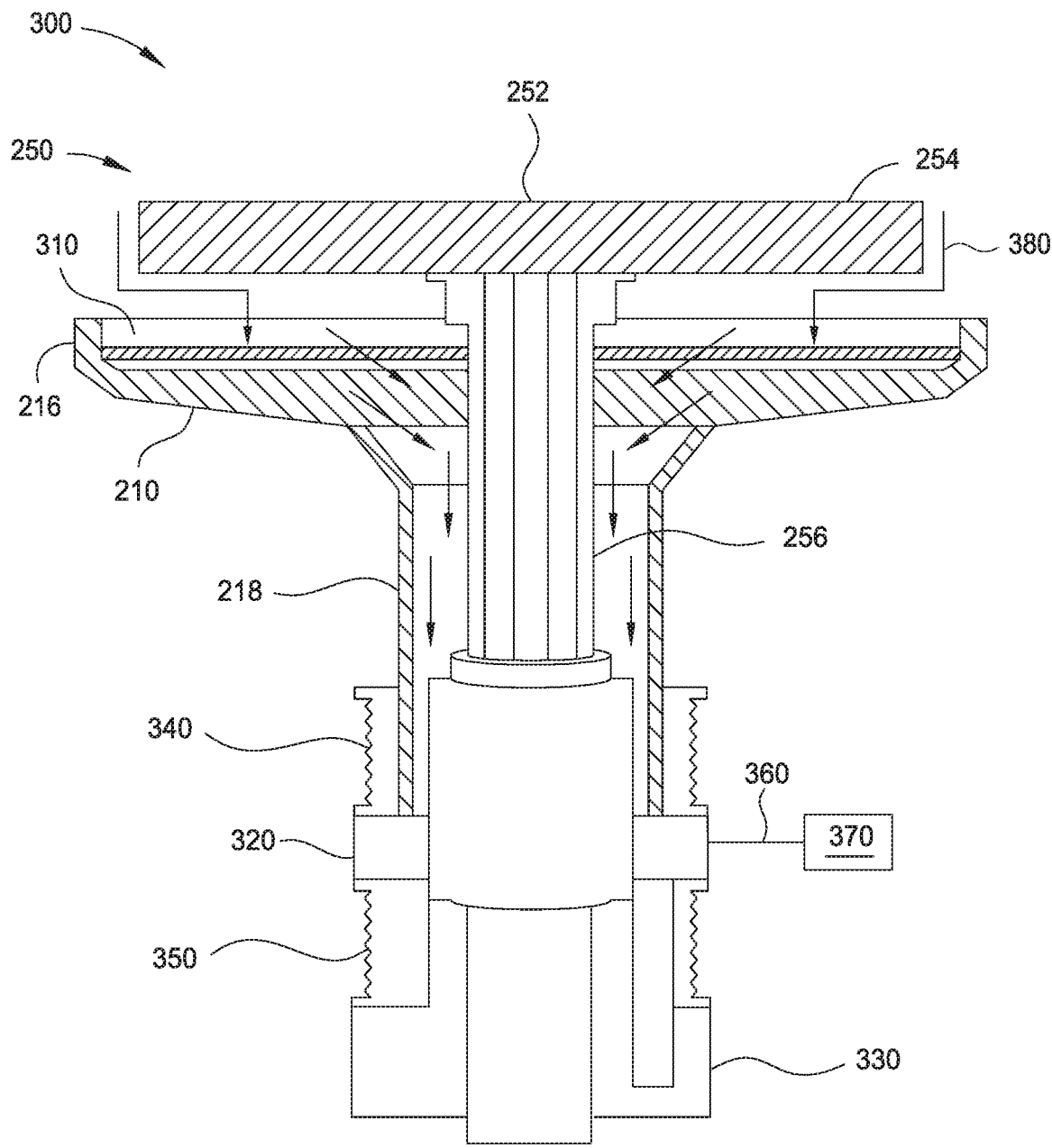
FIG. 3B is a schematic cross-sectional view of the portion of the plasma-processing system depicted in FIG. 3A.

FIG. 3A is an exploded perspective view of a portion of a plasma-processing system 300 incorporating the bottom isolation assembly 210 according to implementations described herein. FIG. 3B is a schematic cross-sectional view of the portion of the plasma-processing system 300 depicted in FIG. 3A. The plasma-processing system 300 includes a pumping plate 310 positioned in the bottom isolation assembly 210. The pumping plate 310 is configured to control the flow of exhaust from the processing volume of the chamber. The pumping plate 310 may having a plurality of holes formed therethrough in a section thereof. The pumping plate 310 may be designed with holes positioned to provide a desired gas distribution (e.g., an even or purposely uneven gas distribution, as desired) to compensate for heat loss imbalance. The pumping plate 310 typically comprises a ceramic material. In one implementation, the pumping plate 310 is composed of a ceramic material. In another implementation, the pumping plate 310 is composed of an aluminum material coated with a ceramic material.

The bottom isolation assembly 210 is independently movable relative to the substrate support assembly 250. The support shaft 256 couples the support pedestal 252 to a first linear actuator assembly (not shown) via a first movable bracket 320. The pedestal stem 218 couples the bottom isolation assembly 210 to a second linear actuator assembly (not shown) via a second movable bracket 330. In one implementation, as depicted in FIG. 3, the first movable bracket 320 and the second movable bracket 330 are connected through serially and coaxially assembled bellows. The coaxially assembled bellows includes a first stage bellows 340 and second stage bellows 350.

A foreline conduit 360 is coupled with the first processing volume 235 and the second processing volume 240 for removing processing gases from the first processing volume 235 and the second processing volume 240. The foreline conduit 360 is typically coupled with a vacuum source 370. The flow path of processing gases from the processing volumes 235, 240 toward the vacuum source 370 is depicted by arrow 380. The foreline conduit 360 can be fixed or movable depending upon the number of bellows. In some implementations where there are two bellows stages, the foreline conduit 360 is movable. In some implementations where there are three bellows stages, the foreline conduit 360 is fixed.

FIG. 4A is an exploded perspective view of a portion of the plasma-processing system 100 incorporating the bottom isolation assembly 180 according to implementations described herein. FIG. 4B is an exploded perspective view of the portion of the plasma-processing system 100 depicted in FIG. 4A. The portion of the plasma-processing system 100 shows the positioning of the bottom isolation assembly 180 relative to faceplate 146. A pumping plate 410 is positioned in the bottom isolation assembly 180. An isolator ring 420 is positioned between the bottom isolation assembly 180 and the faceplate 146 to provide electrical isolation between the faceplate 146 and the bottom isolation assembly 180. In one implementation, the isolator ring 420 is a ceramic isolator ring formed from ceramic material, for example, aluminum nitride ($Al_xN_y$) or aluminum oxide ($Al_2O_3$). In some implementations, the isolator ring 420 also helps to isolate the second processing volume 240 from the first processing volume 235.

Figure 5:
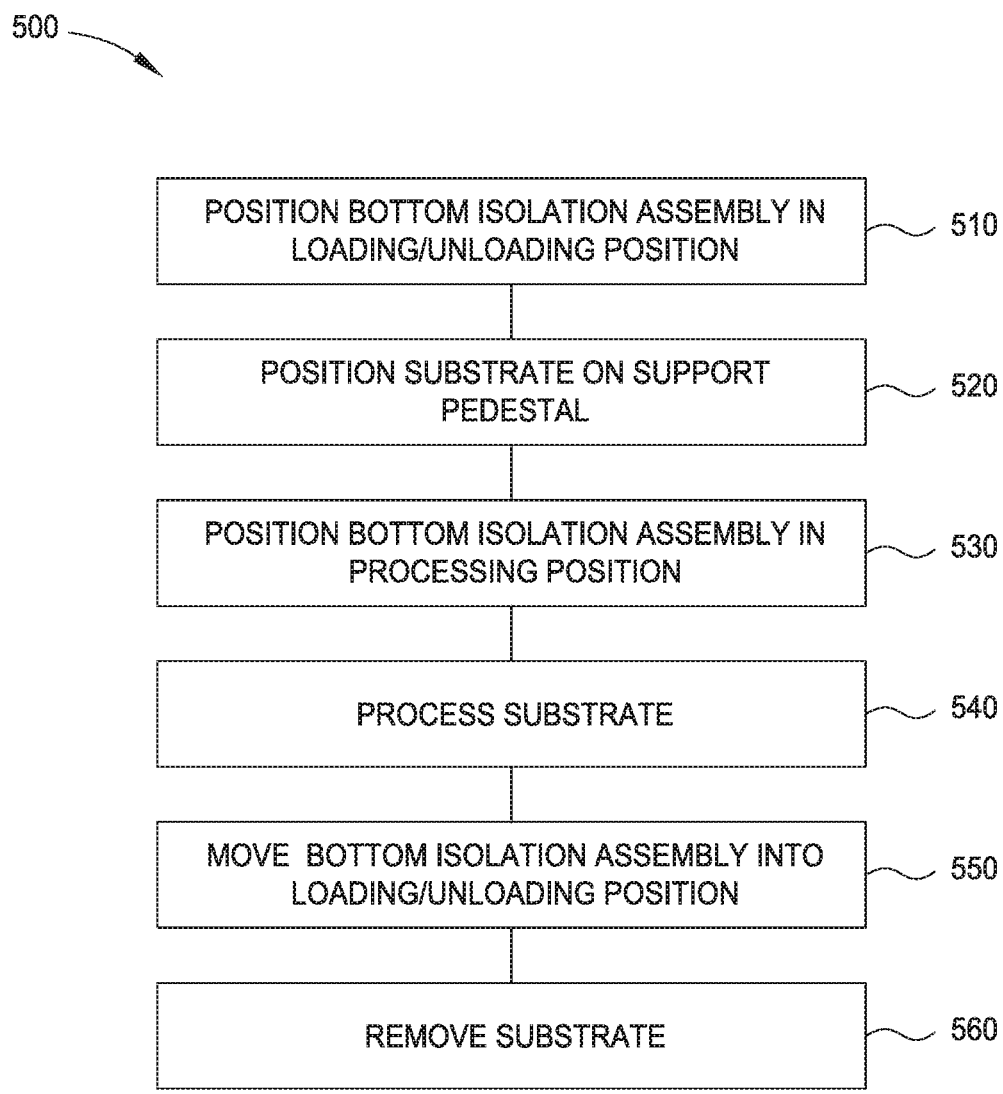
FIG. 5 is a flow chart illustrating a method of processing a substrate with a bottom isolation assembly according to one or more implementations described herein.

FIG. 5 is a flow chart illustrating a method 500 of processing a substrate with a bottom isolation assembly according to one or more implementations described herein. At operation 510, the method 500 begins with the bottom isolation assembly positioned in a substrate loading position. The bottom isolation assembly may be bottom isolation assembly 180 or bottom isolation assembly 210. In the substrate loading position the bottom isolation assembly is spaced-apart from the chamber lid assembly (e.g., chamber lid assembly 104). At operation 520, a substrate is positioned on a pedestal assembly. In one implementation, the pedestal assembly is the pedestal assembly 128 or the support pedestal 252. A loading robot delivers the substrate through a slit valve in the chamber wall onto the pedestal assembly. At operation 530, after the substrate is positioned on the pedestal assembly, the bottom isolation assembly is moved to a processing position by vertically translating the bottom isolation assembly to form a seal with a portion of the chamber (e.g., chamber lid assembly). As previously discussed herein, the seal may be a physical seal (e.g., O-ring) or the seal may be formed using differential pressure or a gas curtain. In the processing position, the bottom isolation assembly defines an isolated processing volume within the processing chamber volume with the pedestal assembly and substrate positioned in the isolated processing volume. At operation 540, the substrate is processed. In one implementation, the substrate is exposed to a removal process where material is removed from the substrate. In another implementation, the substrate is exposed to a deposition process where processing gases flow into the isolated processing volume and material is deposited on the substrate. After the deposition process, spent process gases and byproducts are exhausted from the isolated processing volume through, for example, an exhaust conduit formed by the bottom isolation assembly. At operation 550, after processing of the substrate is completed, the bottom isolation assembly translates linearly away from the process volume on a linear guide or some other means, hence breaking the effective seal against the chamber.

In the loading position, substrate lift pins, which rest on a surface of the bottom isolation assembly and move vertically as the bottom isolation assembly moves upward or the pedestal assembly moves downward. The substrate lift pins extend through the pedestal assembly. The substrate lift pins selectively space the substrate from the pedestal assembly to facilitate exchange of the substrate with a robot utilized for transferring the substrate out of the isolated processing volume. At operation 560, the substrate is removed from the processing chamber through a slit-valve and the processing chamber is prepared for processing of the next substrate.

In summary, some benefits of some of the implementations of the present disclosure include achievement of processing chamber isolation using a ceramic or metal "bottom isolation assembly" positioned inside the processing chamber. The bottom isolation assembly forms a seal with the chamber wall or other chamber component (e.g., chamber lid assembly) to create a uniform and isolated processing volume within the processing volume of the processing chamber. The uniform and isolated processing volume is isolated from the processing volume of the processing chamber. This uniform and isolated processing volume is further isolated from the atmosphere outside of the processing chamber. The ability to provide a uniform and isolated processing volume is particularly beneficial in processing systems containing multiple chambers for simultaneously processing substrates. The bottom isolation assembly can provide substantially identical processing volumes in different processing volumes, which allows for improved control of processing conditions leading to uniform deposition on the simultaneously processed substrate and increased substrate throughput.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present invention, other and further implementations of the invention may be devised without departing from the basic scope thereof, and the scope thereof is determined by the claims that follow.

The invention claimed is:

1. A plasma-processing chamber, comprising:
   a chamber body including chamber walls, a chamber floor, and a lid support;
   a substrate support assembly at least partially disposed within the chamber body and configured to support a substrate;
   a lid assembly disposed over the substrate support assembly and positioned on the lid support wherein the lid assembly and the chamber body define a first processing volume; and
   a bottom isolation assembly that is positioned below and circumscribes at least a portion of the substrate support assembly and is vertically movable from a loading position to a processing position, wherein a seal is formed between the bottom isolation assembly and the lid assembly when the bottom isolation assembly is in the processing position, wherein the substrate support assembly and the bottom isolation assembly are independently movable relative to each other.

2. The plasma-processing chamber of claim 1, wherein the bottom isolation assembly and the lid assembly define a second processing volume which is smaller than and within the first processing volume when the bottom isolation assembly is in the processing position.

3. The plasma-processing chamber of claim 2, wherein the second processing volume is isolated from the first processing volume when the bottom isolation assembly is in the processing position.

4. The plasma-processing chamber of claim 1, wherein the bottom isolation assembly comprises:
   a base plate including a bottom surface; and
   a sidewall extending from the bottom surface.

5. The plasma-processing chamber of claim 4, wherein the bottom isolation assembly further comprises a pumping plate disposed on the base plate.

6. The plasma-processing chamber of claim 5, wherein the bottom isolation assembly has an exhaust conduit extending from the bottom surface of the base plate.

7. The plasma-processing chamber of claim 4, wherein the substrate support assembly comprises:
   a support shaft; and
   a heater pedestal disposed on the support shaft for supporting the substrate, wherein the support shaft extends through the chamber floor and the bottom surface of the base plate.

8. The plasma-processing chamber of claim 7, wherein the support shaft is coupled with a first actuator via a first movable bracket for vertically moving the substrate support assembly.

9. The plasma-processing chamber of claim 8, wherein the bottom isolation assembly is coupled with a second actuator via a second movable bracket for vertically moving the bottom isolation assembly from the loading position to the processing position.

10. The plasma-processing chamber of claim 9, wherein the first movable bracket and the second movable bracket are connected through serially and coaxially assembly bellows.

11. The plasma-processing chamber of claim 1, further comprising a ceramic isolator ring positioned between the lid assembly and the bottom isolation assembly.

12. The plasma-processing chamber of claim 1, further comprising one or more lift pins for lifting the substrate off of the substrate support assembly.

13. The plasma-processing chamber of claim 1, wherein the bottom isolation assembly is aluminum.

14. A twin chamber processing system for processing substrates, comprising:
   a first processing chamber, comprising:
      a first chamber body including first chamber walls, a first chamber floor, and a first lid support;
      a first substrate support assembly at least partially disposed within the first chamber body and configured to support a first substrate;
      a first lid assembly disposed over the first substrate support assembly and positioned on the first lid support wherein the first lid assembly and the first chamber body define a first processing volume; and
      a first bottom isolation assembly that is positioned below and circumscribes at least a portion of the first substrate support assembly and is vertically movable from a loading position to a processing position, wherein a first seal is formed between the first bottom isolation assembly and the first lid assembly when the first bottom isolation assembly is in the processing position, wherein the first substrate support assembly and the first bottom isolation assembly are independently movable relative to each other; and a second processing chamber, comprising:
- a second chamber body including second chamber walls, a second chamber floor, and a second lid support;
- a second substrate support assembly at least partially disposed within the second chamber body and configured to support a second substrate;
- a second lid assembly disposed over the second substrate support assembly and positioned on the second lid support wherein the second lid assembly and the second chamber body define a second processing volume; and
- a second bottom isolation assembly that is positioned below and circumscribes at least a portion of the second substrate support assembly and is vertically movable from a loading position to a processing position, wherein a second seal is formed between the second bottom isolation assembly and the second lid assembly when the second bottom isolation assembly is in the processing position, wherein the second substrate support assembly and the second bottom isolation assembly are independently movable relative to each other.

15. The processing system of claim 14, wherein the first bottom isolation assembly and the first lid assembly define a third processing volume, which is smaller than, and within the first processing volume when the first bottom isolation assembly is in the processing position.

16. The processing system of claim 15, wherein the second bottom isolation assembly and the second lid assembly define a fourth processing volume, which is smaller than, and within the second processing volume when the second bottom isolation assembly is in the processing position.

17. The processing system of claim 16, wherein the third processing volume and the fourth processing volume are substantially identical volumes.

18. The processing system of claim 14, wherein the first substrate support assembly comprises:
- a support shaft; and
- a pedestal disposed on the support shaft for supporting the first substrate, wherein the support shaft extends through the first chamber floor and a bottom surface of the first bottom isolation assembly.

19. A method of processing a substrate, comprising:
positioning a bottom isolation assembly into a loading position in a processing chamber, the processing chamber comprising:
- a chamber body;
- a chamber lid assembly disposed over the chamber body, wherein the chamber body and the chamber lid assembly define a first processing volume;
- a substrate support assembly comprising:
  - a substrate support pedestal positioned within the first processing volume; and
  - the bottom isolation assembly that is positioned below and circumscribes at least a portion of the substrate support assembly, wherein the substrate support assembly and the bottom isolation assembly are independently movable relative to each other and the bottom isolation assembly is spaced-apart from the chamber lid assembly positioned above the bottom isolation assembly in the loading position;

positioning a substrate on the substrate support pedestal;
moving the bottom isolation assembly into a processing position, wherein a seal is formed between the bottom isolation assembly and the chamber lid assembly defining a second processing volume that is positioned within and isolated from the first processing volume; and
processing the substrate.

20. The method of claim 19, further comprising:
moving the bottom isolation assembly into an unloading position; and
removing the substrate from the substrate support pedestal.

21. A plasma-processing chamber, comprising:
- a chamber body including chamber walls, a chamber floor, and a lid support;
- a substrate support assembly at least partially disposed within the chamber body and configured to support a substrate;
- a lid assembly disposed over the substrate support assembly and positioned on the lid support wherein the lid assembly and the chamber body define a first processing volume; and
- a bottom isolation assembly that is positioned below and circumscribes at least a portion of the substrate support assembly and is vertically movable from a loading position to a processing position, the bottom isolation assembly, comprising:
  - a base plate including a bottom surface;
  - a sidewall extending from the bottom surface; and
  - a pumping plate disposed on the base plate, wherein a seal is formed between the bottom isolation assembly and the lid assembly when the bottom isolation assembly is in the processing position.

22. A plasma-processing chamber, comprising:
- a chamber body including chamber walls, a chamber floor, and a lid support;
- a substrate support assembly at least partially disposed within the chamber body and configured to support a substrate, the substrate support assembly, comprising:
  - a support shaft; and
  - a heater pedestal disposed on the support shaft for supporting the substrate;
- a lid assembly disposed over the substrate support assembly and positioned on the lid support wherein the lid assembly and the chamber body define a first processing volume; and
- a bottom isolation assembly that circumscribes at least a portion of the substrate support assembly and is vertically movable from a loading position to a processing position, the bottom isolation assembly, comprising:
  - a base plate including a bottom surface; and
  - a sidewall extending from the bottom surface,
    wherein a seal is formed between the bottom isolation assembly and the lid assembly when the bottom isolation assembly is in the processing position, and
    wherein the support shaft is coupled with a first actuator via a first movable bracket for vertically moving the substrate support assembly and the support shaft extends through the chamber floor and the bottom surface of the base plate.

* * * * *